United States Patent [19]

Lee

[11] Patent Number: 5,767,006
[45] Date of Patent: Jun. 16, 1998

[54] METHOD FOR ELIMINATING CHARGE DAMAGE DURING ETCHING OF CONDUCTING LAYERS

[75] Inventor: Jian-Huei Lee, Hsin-Chu, Taiwan

[73] Assignee: Taiwan Semiconductor Manufacturating Company, Ltd., Hsin-Chu, Taiwan

[21] Appl. No.: 721,670

[22] Filed: Sep. 27, 1996

[51] Int. Cl.$^6$ .................................................. H01L 21/44
[52] U.S. Cl. ................ 438/597; 438/669; 438/622; 438/707; 438/709; 438/710; 438/712; 438/719; 438/720; 438/742
[58] Field of Search ....................... 457/195, 200; 438/597, 598, 599, 666, 669, 618, 625, 706, 709, 710, 712, 742, 719, 720, 707, 622

[56] References Cited

U.S. PATENT DOCUMENTS

| | | | |
|---|---|---|---|
| 5,049,514 | 9/1991 | Mori | 437/200 |
| 5,393,701 | 2/1995 | Ko et al. | 437/193 |

OTHER PUBLICATIONS

S.Wolf, "Silicon Processing for the VLSI Era–vol. 2", Lattice Press, Sunset Beach, CA, pp.160–162 no date.

*Primary Examiner*—Charles L. Bowers, Jr.
*Assistant Examiner*—Lynne A. Gurley
*Attorney, Agent, or Firm*—George O. Saile; Stephen B. Ackerman

[57] ABSTRACT

A plasma etch method for patterning for use within an integrated circuit a blanket conductor layer such that an integrated circuit layer adjoining the blanket conductor layer is not damaged when the blanket conductor layer is patterned to form a patterned conductor layer through the plasma etch method. There is first provided a semiconductor substrate. There is then formed over the semiconductor substrate a blanket conductor layer, where the blanket conductor layer communicates electrically with the semiconductor substrate in a fashion such that an electrical charge is shunted from the blanket conductor layer into the semiconductor substrate when the blanket conductor layer is patterned to form the patterned conductor layer through the plasma etch method. There is then patterned through the plasma etch method the blanket conductor layer to form the patterned conductor layer.

16 Claims, 4 Drawing Sheets

METHOD FOR ELIMINATING CHARGE DAMAGE DURING ETCHING OF CONDUCTING LAYERS

BACKGROUND OF THE INVENTION

1. Field of the Invention

The present invention relates generally to plasma etching of blanket conductor layers to form patterned conductor layers within integrated circuits. More particularly, the present invention relates to a method for eliminating plasma induced electrical charge damage to an integrated circuit layer adjoining a blanket conductor layer when the blanket conductor layer is etched to form a patterned conductor layer through a plasma etch method.

2. Description of the Related Art

When employing plasma etch methods, such as but not limited to microwave plasma etch methods, reactive ion etch (RIE) plasma etch methods, magnetically enhanced reactive ion etch (MERIE) plasma etch methods and electron cyclotron resonance (ECR) plasma etch methods, for etching a blanket conductor layer to form a patterned conductor layer within an integrated circuit, it is known in the art of integrated circuit fabrication that the blanket conductor layer and any other integrated circuit layers exposed to the plasma etch method will typically become electrically charged incident to exposure of the blanket conductor layer to the plasma employed within the plasma etch method. Blanket conductor layers are typically particularly susceptible to electrical charging within a plasma etch method employed in forming patterned conductor layers from those blanket conductor layers since electrical charge formed upon a blanket conductor layer may be readily redistributed due to the conductive character of the blanket conductor layer.

While the phenomenon of electrical charge generation within blanket conductor layers incident to patterning those blanket conductor layers to form patterned conductor layers through plasma etch methods is known in the art, the phenomenon of electrical charge generation within blanket conductor layers incident to patterning those blanket conductor layers through plasma etch methods is nonetheless problematic. The phenomenon of electrical charge generation is particularly problematic under circumstances where a patterned conductor layer of narrow linewidth is desired to be formed from a blanket conductor layer. Under such circumstances, the charge generated within the blanket conductor layer becomes exceedingly dense as the blanket conductor layer is patterned to form the narrow linewidth patterned conductor layer. Under circumstances where the narrow linewidth patterned conductor layer so formed adjoins a dielectric layer or other integrated circuit layer of limited dielectric capacity, an electrical discharge may occur through the dielectric layer or other integrated circuit layer of limited dielectric capacity while patterning the blanket conductor layer to form the narrow linewidth patterned conductor layer. Such an electrical discharge may often damage the dielectric layer or other integrated circuit layer.

A particularly common example where damage may occur to an adjoining dielectric layer when patterning a blanket conductor layer to form a patterned conductor layer is encountered when patterning a blanket gate electrode material layer formed upon a blanket gate dielectric layer when forming for use within a field effect transistor (FET) a gate electrode from the blanket gate electrode material layer. A series of schematic cross-sectional diagrams illustrating the mechanism through which such damage may occur is illustrated by reference to FIG. 1 to FIG. 3.

Figure 1:
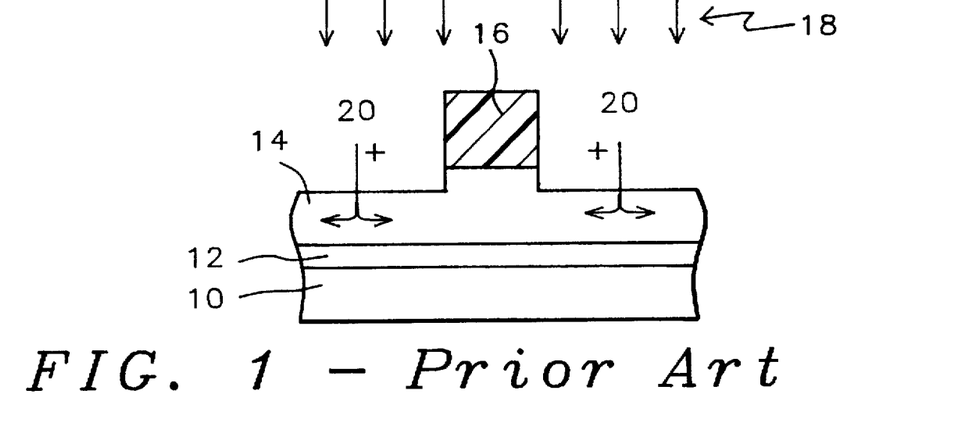
FIG. 1 to FIG. 3 show a series of schematic cross-sectional diagrams illustrating charge flow and dissipation incident to forming a gate electrode from a blanket gate electrode material layer through a plasma etch method conventional in the art.

Shown in FIG. 1 is a semiconductor substrate 10 having formed thereupon a blanket gate dielectric layer 12. Formed upon the blanket gate dielectric layer 12 is a partially patterned gate electrode material layer 14 which is being patterned through a plasma etch method employing a plasma 18 and a patterned photoresist layer 16. As is shown in FIG. 1, the direction of charge flow/dissipation 20 from the plasma 18 is within the partially patterned gate electrode material layer 14 both towards and away from the patterned photoresist layer 16.

Figure 2:
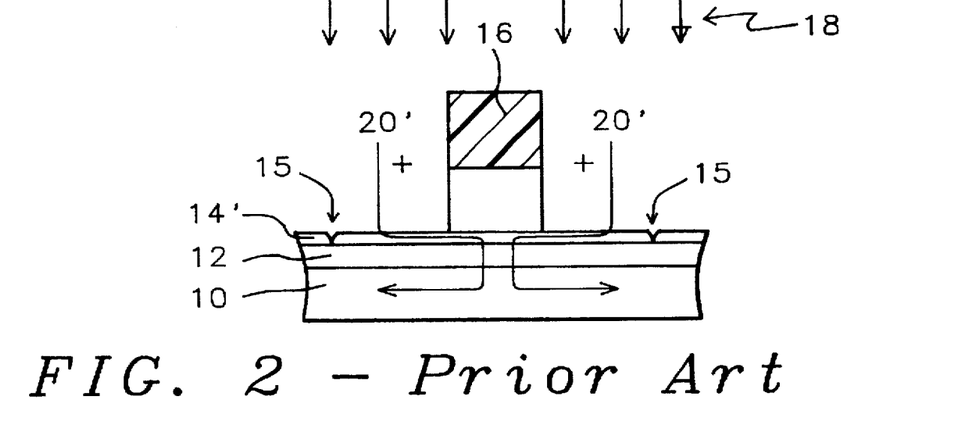

As is shown in FIG. 2, upon further patterning of the partially patterned gate electrode material layer 14 within the plasma 18 there is formed a further partially patterned gate electrode material layer 14'. The further partially patterned gate electrode material layer 14' is of sufficiently limited thickness such that breaks 15 occur in the further partially patterned gate electrode material layer 14', thus yielding a direction of charge flow/dissipation 20' from the plasma 18 no longer exclusively through the further partially patterned gate electrode material layer 14'. Rather, the direction of charge flow/dissipation 20' from the plasma 18 is sequentially through: (1) the thicker portion of the further partially patterned gate electrode material layer 14' beneath the patterned photoresist layer 16; and (2) the portion of the blanket gate dielectric layer 12 beneath the patterned photoresist layer 16, resulting ultimately in charge flow and dissipation into the semiconductor substrate 10. Under circumstances where substantial quantities of charge flow and are dissipated through the direction of charge flow/dissipation 20' as illustrated in FIG. 2, damage may occur to the portion of the blanket gate dielectric layer 12 formed beneath the patterned photoresist layer 16.

Figure 3:
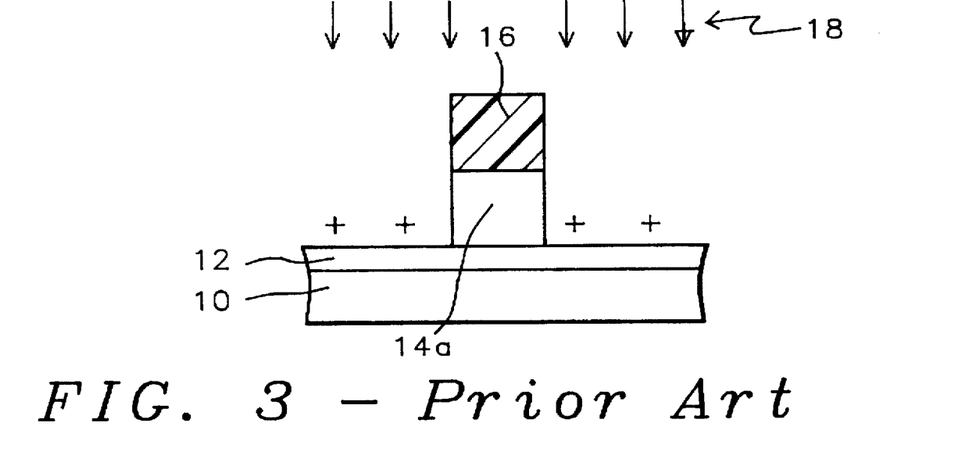

Finally, as is shown in FIG. 3, when the further partially patterned gate electrode material layer 14' has been completely patterned to yield the gate electrode 14a, there is no longer any charge flow and dissipation through the portion of the blanket gate dielectric layer 12 formed beneath the gate electrode 14a and consequently also no additional damage to the portion of the blanket gate dielectric layer 12 formed beneath the gate electrode 14a.

Although FIG. 1 to FIG. 3 illustrate the charges formed incident to patterning the partially patterned gate electrode material layer 14 as positive charges, it is theoretically possible, although in practice typically not preferred, that there may alternatively be formed negative charges within a partially patterned conductor layer, such as the partially patterned gate electrode material layer 14, when the partially patterned conductor layer is patterned to form a patterned conductor layer through a plasma etch method employing a plasma such as the plasma 18. The presence of positive or negative charges within the partially patterned conductor layer is typically largely determined by the polarity of an electrical bias applied to a semiconductor substrate, such as the semiconductor substrate 10, over which is formed the partially patterned conductor layer, since plasmas employed within plasma etch methods will typically have formed therein both positive and negative charged species.

Thus, it is towards the goal of limiting within integrated circuits damage to integrated circuit layers adjoining blanket conductor layers when those blanket conductor layers are patterned to form patterned conductor layers through plasma etch methods that the present invention is generally directed.

Methods through which there may be avoided flow and dissipation of charges through patterned conductor layers in a fashion to avoid damage which would otherwise occur to integrated circuit devices connected to those patterned conductor layers are known in the art. For example, Ko et al. in U.S. Pat. No. 5,393,701 discloses a method which includes deliberately forming an electrical circuit break within a patterned conductor layer to avoid flow and dissipation of charges through the patterned conductor layer, where the electrical circuit break within the patterned conductor layer is subsequently repaired with a shunt formed from an upper lying patterned conductor layer within the integrated circuit within which is formed the patterned conductor layer with the deliberate electrical circuit break. In addition, Wolf in Silicon Processing for the VLSI Era, Vol. 2: Process Integration, Lattice Press (Sunset Beach, Calif.; 1990) pp. 160–62 discloses various schemes for providing within integrated circuits electrical connections between conductor layers and semiconductor substrates.

Desirable in the art are additional methods through which there may be avoided within integrated circuits damage to integrated circuit layers adjoining blanket conductor layers when those blanket conductor layers are patterned to form patterned conductor layers through plasma etch methods. Particularly desirable are methods through which there may be avoided damage to gate oxide layers formed beneath gate electrodes when blanket conductor layers in electrical communication with those gate electrodes are patterned to form patterned conductor layers through plasma etch methods. It is towards these goals that the present invention is specifically directed.

SUMMARY OF THE INVENTION

A first object of the present invention is to provide a method for forming within an integrated circuit a patterned conductor layer from a blanket conductor layer through a plasma etch method.

A second object of the present invention is to provide a method in accord with the first object of the present invention, where there is avoided plasma induced damage to an integrated circuit layer adjoining the blanket conductor layer when the blanket conductor layer is patterned to form the patterned conductor layer through the plasma etch method.

A third object of the present invention is to provide a method in accord with the first object of the present invention and the second object of the present invention, where the patterned conductor layer electrically communicates with a gate electrode and where there is avoided plasma induced damage to a gate dielectric layer formed beneath the gate electrode when the blanket conductor layer is patterned to form the patterned conductor layer through the plasma etch method.

In accord with the objects of the present invention, there is provided by the present invention a method for forming within an integrated circuit a patterned conductor layer from a blanket conductor layer through a plasma etch method. To practice the method of the present invention, there is first provided a semiconductor substrate. There is then formed over the semiconductor substrate a blanket conductor layer, where the blanket conductor layer communicates electrically with the semiconductor substrate in a fashion such that an electrical charge formed within the blanket conductor layer upon patterning the blanket conductor layer to form a patterned conductor layer through a plasma etch method is shunted from the blanket conductor layer into the semiconductor substrate. Finally, the blanket conductor layer is patterned to form the patterned conductor layer through the plasma etch method.

There is provided by the present invention a method for forming within an integrated circuit a patterned conductor layer from a blanket conductor layer through a plasma etch method, where there is avoided plasma induced damage to an integrated circuit layer adjoining the blanket conductor layer when the blanket conductor layer is patterned to form the patterned conductor layer through the plasma etch method. By forming through the method of the present invention a blanket conductor layer which electrically communicates with a semiconductor substrate over which the blanket conductor layer is formed, an electrical charge which is formed through patterning the blanket conductor layer to form a patterned conductor layer through a plasma etch method may be shunted into the semiconductor substrate where it may be more effectively dissipated.

The method of the present invention may be employed where the blanket conductor layer electrically communicates with a gate electrode and where there is avoided plasma induced damage to a gate dielectric layer formed beneath the gate electrode when the blanket conductor layer is patterned to form a patterned conductor layer through the plasma etch method. The method of the present invention does not discriminate with respect to the nature of the integrated circuit layer which adjoins the blanket conductor layer which is patterned into a patterned conductor layer through the method of the present invention. Thus, the method of the present invention may be employed in avoiding plasma induced damage to a gate dielectric layer when forming through a plasma etch method a patterned conductor layer in electrical communication with a gate electrode formed upon the gate dielectric layer.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming for use within an integrated circuit a patterned conductor layer from a blanket conductor layer while employing a plasma etch method, where there is avoided plasma induced damage to an integrated circuit layer adjoining the blanket conductor layer when the blanket conductor layer is patterned to form the patterned conductor layer through the plasma etch method. The method of the present invention achieves this goal through forming the blanket conductor layer over a semiconductor substrate, where the blanket conductor layer electrically communicates with the semiconductor substrate such that an electrical charge generated incident to the plasma etch method when forming the patterned conductor layer from the blanket conductor layer is shunted into the semiconductor substrate and effectively dissipated. For a general application of the method of the present invention, the blanket conductor layer may be formed from a conductive material chosen from the group of conductive materials including but not limited to metals, metal alloys, highly doped polysilicon and polycides (highly doped polysilicon/ metal silicide stacks). Typically and preferably, the blanket conductor layer will in general have a thickness of from about 500 to about 7000 angstroms.

The method of the present invention may be employed in forming patterned conductor layers from blanket conductor layers, while employing plasma etch methods, within various types of integrated circuits. The method of the present invention may be employed in forming patterned conductor layers from blanket conductor layers, while employing plasma etch methods, within integrated circuits including but not limited to dynamic random access memory (DRAM) integrated circuits, static random access memory (SRAM) integrated circuits, application specific integrated circuits (ASICs), integrated circuits having within their fabrications field effect transistors (FETs), integrated circuits having within their fabrications bipolar transistors and integrated circuits having within their fabrications bipolar complementary metal oxide semiconductor (BiCMOS) transistors.

Although the preferred embodiment of the method of the present invention illustrates the method of the present invention employed in successively forming through a first plasma etch method and a second plasma etch method a pair of patterned conductor layers within an integrated circuit while not damaging insulator layers which are formed beneath those patterned conductor layers, the method of the present invention may be employed in forming patterned conductor layers adjoining integrated circuit layers other than dielectric layers. Such other layers may include but are not limited to other conductor layers, semiconductor layers and photoactive layers.

Figure 4:
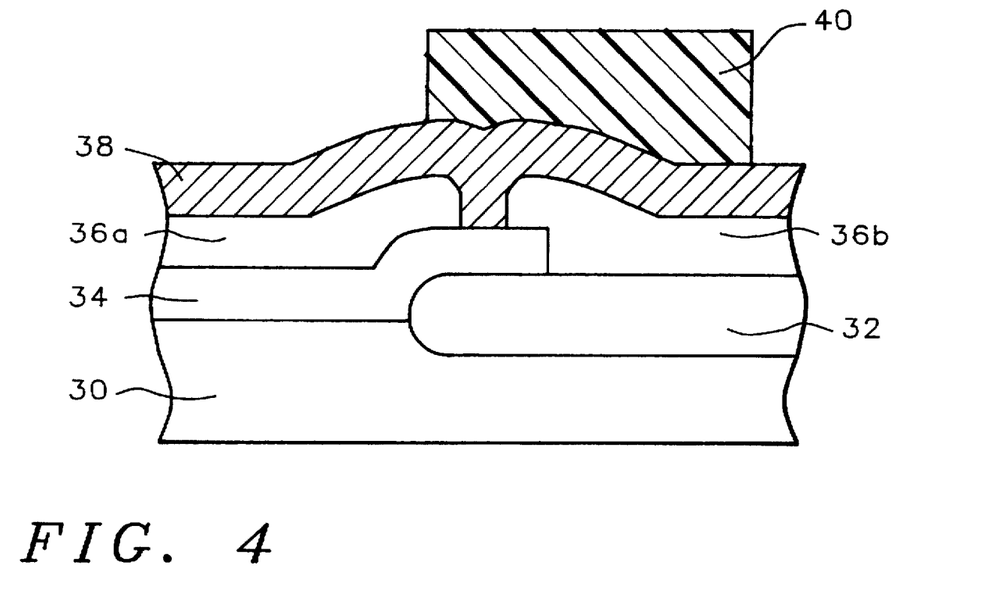
FIG. 4 to FIG. 7 show a series of schematic cross-sectional diagrams illustrating the results of progressive process stages in successively forming within an integrated circuit two patterned conductor metal layers from two blanket conductor metal layers, through two separate plasma etch methods employed within the preferred embodiment of the method of the present invention.

Referring now to FIG. 4 to FIG. 7, there is shown a series of schematic cross-sectional diagrams illustrating the results of progressive stages in forming through successive plasma etch methods within an integrated circuit a pair of patterned conductor layers from a pair of blanket conductor layers while employing the method of the present invention. Shown in FIG. 4 is a schematic cross-sectional diagram of the integrated circuit at an early stage in its processing.

Shown in FIG. 4 is a semiconductor substrate 30 having formed within and upon its surface an isolation region 32 which separates active regions of the semiconductor substrate 30. Although semiconductor substrates are known in the art with either dopant polarity, various dopant concentrations and several crystallographic orientations, the semiconductor substrate 30 upon which is practiced the method of the present invention is preferably a (100) silicon semiconductor substrate having an N- or P- doping. Similarly, although it is also known in the art that isolation regions may be formed within or upon semiconductor substrates through methods including but not limited to isolation region thermal growth methods and isolation region deposition/patterning methods, for the preferred embodiment of the method of the present invention, the isolation region 32 is preferably formed within and upon the semiconductor substrate 30 through an isolation region thermal growth method at a temperature of from about 800 to about 1000 degrees centigrade to form the isolation region 32 of silicon oxide within and upon the semiconductor substrate 30.

There is also shown in FIG. 4 the presence of a patterned conductor interconnect layer 34 formed upon the active region of the semiconductor substrate 30 and partially overlapping the isolation region 32. Methods and materials through which patterned conductor interconnect layers may be formed within integrated circuits are known in the art of integrated circuit fabrication. Patterned conductor interconnect layers are typically formed within integrated circuits through patterning, methods as are conventional in the art, of blanket conductor interconnect layers formed within integrated circuits. In turn, blanket conductor interconnect layers may be formed within integrated circuits through methods including but not limited to thermally assisted evaporation methods, electron beam assisted evaporation methods, chemical vapor deposition (CVD) methods and physical vapor deposition (PVD) sputtering methods through which may be formed blanket conductor interconnect layers formed of conductor materials including but not limited to metals, metal alloys, highly doped polysilicon and polycides (highly doped polysilicon/metal silicide stacks). For the preferred embodiment of the method of the present invention, the patterned conductor interconnect layer 34 is preferably formed through patterning, through methods as are conventional in the art, of a blanket conductor interconnect layer formed of highly doped polysilicon or a polycide, having either single or multiple layers deposited through an appropriate method(s), to a total thickness of from about 1000 to about 4000 angstroms. Preferably, the patterned conductor interconnect layer 34 so formed has a resistivity of no greater than about 20 ohms per square.

There is also shown in FIG. 4 the presence of a pair of patterned inter-level dielectric (ILD) layers 36a and 36b formed upon the isolation region 32 and/or the patterned conductor interconnect layer 34, where the pair of patterned inter-level dielectric (ILD) layers 36a and 36b define an interconnection via accessing the patterned conductor interconnect layer 34. The patterned inter-level dielectric (ILD) layers 36a and 36b may be formed through patterning, through methods as are conventional in the art, of a blanket inter-level dielectric (ILD) layer. In turn, the blanket inter-level dielectric (ILD) layer may be formed through methods as are known in the art, including but not limited to chemical vapor deposition (CVD) methods, plasma enhanced chemical vapor deposition (PECVD) methods and physical vapor deposition (PVD) sputtering methods. Preferably, the pair of patterned inter-level dielectric (ILD) layers 36a and 36b is formed from a silicon oxide based dielectric material, preferably at a thickness of from about 4000 to about 10000 angstroms each.

There is also shown in FIG. 4 a blanket first conductor metal layer 38 formed upon the patterned inter-level dielectric (ILD) layers 36a and 36b and into the interconnection via defined by the patterned inter-level dielectric (ILD) layers 36a and 36b, thus making contact with the patterned conductor interconnect layer 34. Methods and materials through which blanket conductor metal layers may be formed within integrated circuits are known in the art of integrated circuit fabrication. Blanket conductor metal layers may be formed within integrated circuits through methods including but not limited to thermally assisted evaporation methods, electron beam assisted evaporation methods and physical vapor deposition (PVD) sputtering methods through which may be formed blanket conductor metal layers of conductor metals and metal alloys. For the preferred embodiment of the method of the present invention, the blanket first conductor metal layer 38 is preferably formed at least in part of an aluminum containing conductor alloy, to a thickness of from about 3000 to about 7000 angstroms, as is common in the art of integrated circuit fabrication.

Finally, there is shown in FIG. 4 the presence of a patterned first photoresist layer 40 formed upon the blanket first conductor metal layer 38. While patterned photoresist layers are known in the art of integrated circuit fabrication to be formed from the general categories of photoresist materials including positive photoresist materials and negative photoresist materials, for the preferred embodiment of the method of the present invention the patterned first photoresist layer 40 is preferably formed from a novolak positive photoresist material as is commonly employed in the art to provide patterned photoresist layers of high dimensional stability. Other types of photoresist materials may, however, be employed in forming the patterned first photoresist layer 40. Preferably, the patterned first photoresist layer 40 is from about 5000 to about 15000 angstroms thick.

Figure 5:
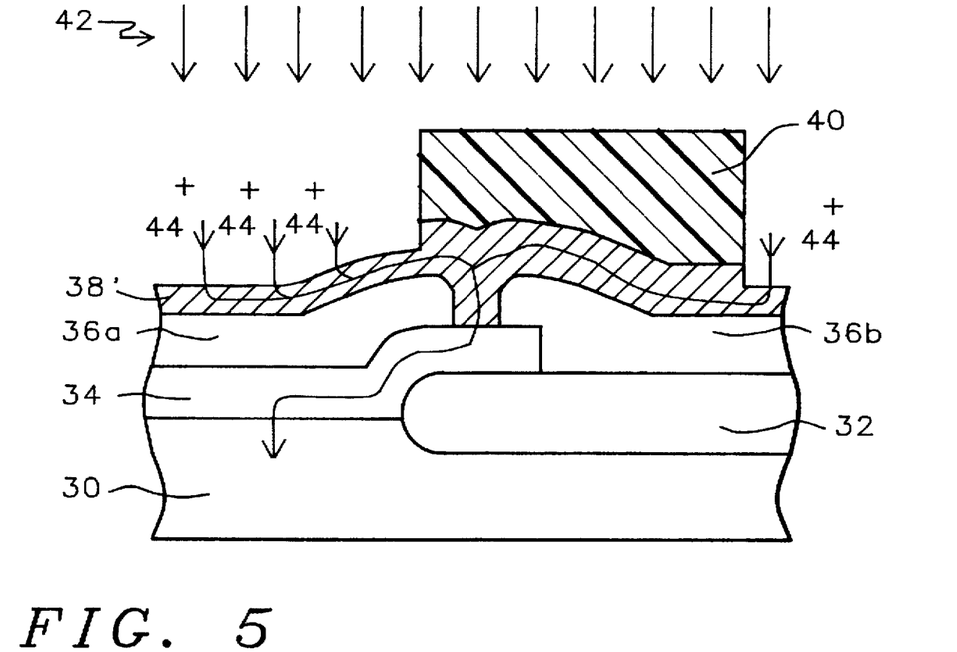

Referring now to FIG. 5, there is shown a schematic cross-sectional diagram illustrating the results of further processing of the integrated circuit whose schematic cross-sectional diagram is illustrated in FIG. 4. Shown in FIG. 5 is the results of patterning the blanket first conductor metal layer 38 through a first plasma etch method employing a first plasma 42, while simultaneously employing the patterned first photoresist layer 40 as a first etch mask layer, to yield a partially patterned first conductor metal layer 38'. When the blanket first conductor metal layer 38 is formed of an aluminum containing conductor alloy, the first plasma 42 preferably comprises a chlorine containing etchant gas composition. As is seen in FIG. 5, the direction of charge flow/dissipation 44 from the first plasma 42 is through the partially patterned first conductor metal layer 38' and the patterned conductor interconnect layer 34, thus terminating finally into the semiconductor substrate 30. When the direction of charge flow/dissipation 44 from the first plasma 42 terminates finally into the semiconductor substrate 30 as illustrated in FIG. 5, there is avoided plasma induced damage to the patterned inter-level dielectric (ILD) layers 36a and 36b, as well as other integrated circuit layers adjoining other conductor layers which electrically communicate with the partially patterned first conductor metal layer 38'. Such other integrated circuit layers may include, but are not limited, to gate dielectric layers formed beneath gate electrodes electrically communicating with the partially patterned first conductor metal layer 38'.

With respect to the first plasma 42, the first plasma 42 may be formed through any of several plasma etch methods which typically induce a substantial charge in the blanket first conductor metal layer 38 when patterning the blanket first conductor metal layer 38 to form the partially patterned first conductor metal layer 38'. Such plasma etch methods include but are not limited to microwave plasma etch methods, reactive ion etch (RIE) plasma etch methods, magnetically enhanced reactive ion etch (MERIE) plasma etch methods and electron cyclotron resonance (ECR) plasma etch methods.

With respect to the point of physical contact between the semiconductor substrate 30 and the patterned conductor interconnect layer 34, it is understood by a person skilled in the art that the patterned conductor interconnect layer 34 when formed of a highly doped polysilicon material or a polycide material of polarity equivalent to the polarity of the semiconductor substrate 30 will form an ohmic contact to the semiconductor substrate 30 through which charge from the first plasma 42 will flow and be readily dissipated into the semiconductor substrate 30. As is also understood by a person skilled in the art, when the patterned conductor interconnect layer 34 is formed of a highly doped polysilicon material or a polycide material of polarity opposite to the polarity of the semiconductor substrate 30, an additional implant of dopant into the semiconductor substrate 30 beneath the point of contact between the patterned conductor interconnect layer 34 and the semiconductor substrate 30 will be needed to form a zener diode through which charge from the first plasma 42 will flow and be readily dissipated into the semiconductor substrate 30.

As is further understood by a person skilled in the art, the method of the present invention may be employed in dissipating plasma induced electrical charges formed within blanket conductor metal layers other than blanket first conductor metal layers when those blanket conductor metal layers are patterned to form patterned conductor metal layers through plasma etch methods. In that regard, there is shown by reference to FIG. 6 and FIG. 7 a pair of schematic cross-sectional diagrams illustrating the results of progressive process stages in forming within the integrated circuit whose schematic cross-sectional diagram is illustrated in FIG. 5 a second patterned conductor metal layer through a second plasma etch method.

Figure 6:
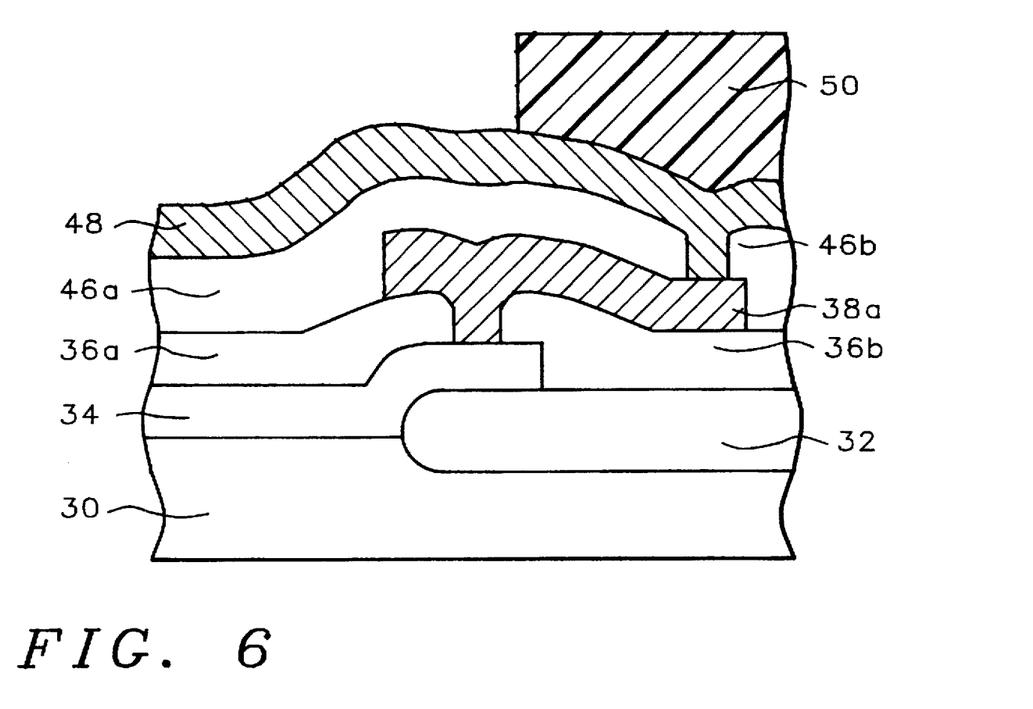

Shown in FIG. 6 is a schematic cross-sectional diagram of an integrated circuit otherwise equivalent to the integrated circuit whose schematic cross-sectional diagram is illustrated in FIG. 5, but wherein the partially patterned first conductor metal layer 38' has been completely patterned to yield the patterned first conductor metal layer 38a through continued exposure to the first plasma etch method employing the first plasma 42. There is then removed from the patterned first conductor metal layer 38a the patterned first photoresist layer 40 through methods as are conventional in the art, which will typically but not exclusively include oxygen plasma photoresist stripping methods.

There is then successively formed upon the integrated circuit, as shown in FIG. 6: (1) a pair of patterned inter-metal dielectric (IMD) layers 46a and 46b formed upon the patterned first conductor metal layer 38a and the patterned inter-level dielectric (ILD) layers 36a and 36b, where the pair of patterned inter-metal dielectric (IMD) layers 46a and 46b defines an interconnection via accessing the patterned first conductor metal layer 38a; (2) a blanket second conductor metal layer 48 formed upon the patterned inter-metal dielectric (IMD) layers 46a and 46b and into the interconnection via accessing the patterned first conductor metal layer 38a; and (3) a patterned second photoresist layer 50 formed upon the blanket second conductor metal layer 48. The pair of patterned inter-metal dielectric (IMD) layers 46a and 46b is preferably formed through methods, materials and dimensions analogous or equivalent to the methods, materials and dimensions employed in forming the pair of patterned inter-level dielectric (ILD) layers 36a and 36b. Similarly, the blanket second conductor metal layer 48 is preferably formed through methods, materials and dimensions analogous or equivalent to the methods, materials and dimensions employed in forming the blanket first conductor metal layer 38. Finally, the patterned second photoresist layer 50 is preferably formed through methods, materials and dimensions analogous or equivalent to the methods, materials and dimensions employed in forming the patterned first photoresist layer 40.

Figure 7:
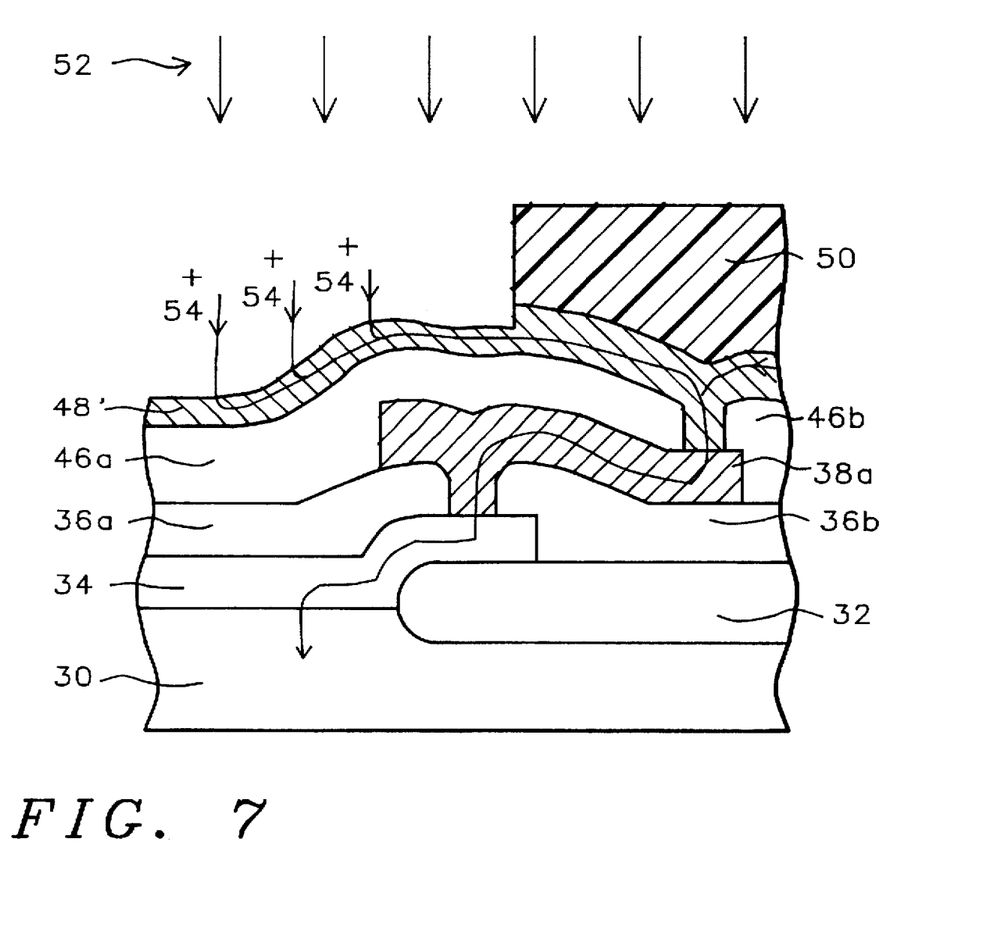

Referring now to FIG. 7, there is shown a schematic cross-sectional diagram illustrating the results of further processing of the integrated circuit whose schematic cross-sectional diagram is illustrated in FIG. 6. Shown in FIG. 7 is the results of patterning through a second plasma etch method employing a second plasma 52, while simultaneously employing the patterned second photoresist layer 50 as an etch mask layer, the blanket second conductor metal layer 48 to form the partially patterned second conductor metal layer 48'. Since the blanket second conductor metal layer 48 is preferably formed through methods and materials analogous or equivalent to the methods and materials employed in forming the blanket first conductor metal layer 38, the second plasma 52 is preferably also formed through methods and materials analogous or equivalent to the methods and materials employed in forming the first plasma 42.

As is seen from FIG. 7, the direction of charge flow/dissipation 54 from the second plasma 52 is sequentially through: (1) the thicker portion of the partially patterned second conductor metal layer 48' beneath the patterned second photoresist layer 50; (2) the patterned first conductor metal layer 38a; and (3) the patterned conductor interconnect layer 34, and finally terminating within the semiconductor substrate 30. By providing the direction of charge flow and dissipation 54 from the second plasma 52 which terminates within the semiconductor substrate 30, there is avoided through the method of the present invention plasma induced damage to layers, such as the patterned inter-metal dielectric (IMD) layers 46a and 46b, which adjoin the blanket second conductor metal layer 48 when the blanket second conductor metal layer 48 is patterned to form the partially patterned second conductor metal layer 48' through the second plasma etch method employing the second plasma 52. Similarly, there is also avoided plasma induced electrical discharge damage to other integrated circuit layers, such as gate dielectric layers formed beneath gate electrodes, where the gate electrodes electrically communicate with the blanket second conductor metal layer 48, when the blanket second conductor metal layer 48 is patterned to form the patterned second conductor metal layer 48' through the second plasma etch method employing the second plasma 52.

Although not specifically illustrated by the integrated circuit whose schematic cross-sectional diagrams are shown in FIG. 4 to FIG. 7, it is typically feasible and preferred within the preferred embodiment of the method of the present invention to form patterned conductor interconnect layers, such as the patterned conductor interconnect layer 34, in contact with a semiconductor substrate, such as the semiconductor substrate 30, at kerf locations of the semiconductor substrate which are intended subsequently to be removed through dicing the semiconductor substrate into integrated circuit dice. By forming patterned conductor interconnect layers, such as the patterned conductor interconnect layer 34, in kerf locations, the available space within an integrated circuit die may be optimally utilized while still employing the method of the present invention.

As is understood by a person skilled in the art, the preferred embodiment of the method of the present invention is illustrative of the present invention rather than limiting of the present invention. Revisions and modifications may be made to methods, materials, structures and dimensions through which is practiced the preferred embodiment of the method of the present invention while providing an embodiment which is within the spirit and scope of the present invention, as defined by the accompanying claims.

What is claimed is:

1. A method for patterning a conductor layer within an integrated circuit comprising:

providing a semiconductor substrate;

forming over the semiconductor substrate a blanket conductor layer, the blanket conductor layer communicating electrically with the semiconductor substrate through a patterned conductor interconnect in direct electrical contact physically contacting the semiconductor substrate in a fashion such that an electrical charge formed within the blanket conductor layer upon patterning the blanket conductor layer to form a patterned conductor layer through a plasma etch method is shunted from the blanket conductor layer through the patterned conductor interconnect in direct electrical contact into the semiconductor substrate; and patterning through the plasma etch method the blanket conductor layer to form the patterned conductor layer.

2. The method of claim 1 wherein the blanket conductor layer is formed from a conductor material chosen from the group of conductor materials consisting of metals, metal alloys, highly doped polysilicon and polycides.

3. The method of claim 2 wherein the blanket conductor layer is formed to a thickness of from about 500 to about 7000 angstroms.

4. The method of claim 1 wherein the plasma etch method is chosen from the group of plasma etch methods consisting of microwave plasma etch methods, reactive ion etch (RIE) plasma etch methods, magnetically enhanced reactive ion etch (MERIE) plasma etch methods and electron cyclotron resonance (ECR) plasma etch methods.

5. The method of claim 1 wherein the direct electrical contact physically contacting the semiconductor substrate is formed through an ohmic contact to the semiconductor substrate.

6. The method of claim 1 wherein the direct electrical contact physically contacting the semiconductor substrate is formed through a zener diode contact to the semiconductor substrate.

7. The method of claim 1 wherein the direct electrical contact physically contacting the semiconductor layer is formed at a kerf region of the semiconductor substrate.

8. The method of claim 1 further comprising forming an integrated circuit layer over the semiconductor substrate prior to forming the blanket conductor layer over the semiconductor substrate, the blanket conductor layer being formed upon the integrated circuit layer.

9. The method of claim 8 where the integrated circuit layer is chosen from the group of integrated circuit layers consisting of dielectric layers, semiconductor layers and photoactive layers.

10. A method for avoiding plasma induced damage to a gate dielectric layer when patterning through a plasma etch method a blanket conductor layer electrically communicating with a gate electrode, where the gate electrode is formed upon the gate dielectric layer, comprising:

providing a semiconductor substrate;

forming upon the semiconductor substrate a gate dielectric layer;

forming upon the gate dielectric layer a gate electrode;

forming in electrical communication with the gate electrode a blanket conductor layer, the blanket conductor layer also communicating electrically with the semiconductor substrate through a patterned conductor interconnect in direct electrical contact physically contacting the semiconductor substrate in a fashion such that an electrical charge formed within the blanket conductor layer upon patterning the blanket conductor layer to form a patterned conductor layer through a plasma etch method is shunted from the blanket conductor layer through the patterned conductor interconnect in direct electrical contact into the semiconductor substrate; and patterning through the plasma etch method the blanket conductor layer to form a patterned conductor layer.

11. The method of claim 10 wherein the blanket conductor layer is formed from a conductor material chosen from the group of conductor materials consisting of metals and metal alloys.

12. The method of claim 11 wherein the blanket conductor layer is formed to a thickness of from about 3000 to about 7000 angstroms.

13. The method of claim 10 wherein the plasma etch method is chosen from the group of plasma etch methods consisting of microwave plasma etch methods, reactive ion etch (RIE) plasma etch methods, magnetically enhanced reactive ion etch (MERIE) plasma etch methods and electron cyclotron resonance (ECR) plasma etch methods.

14. The method of claim 10 wherein the direct electrical contact physically contacting the semiconductor substrate is formed through an ohmic contact to the semiconductor substrate.

15. The method of claim 10 wherein the direct electrical contact physically contacting the semiconductor substrate is formed through a zener diode contact to the semiconductor substrate.

16. The method of claim 10 wherein the direct electrical contact physically contacting the semiconductor substrate is formed at a kerf region of the semiconductor substrate.

* * * * *